(12) United States Patent
Miao et al.

(10) Patent No.: US 12,453,221 B2
(45) Date of Patent: Oct. 21, 2025

(54) MICRO LED DISPLAY DEVICE

(71) Applicant: HON HAI PRECISION INDUSTRY CO., LTD., New Taipei (TW)

(72) Inventors: Wen-Chien Miao, Hsinchu (TW); Hsin Chiang, Hsinchu (TW); Fu-He Hsiao, Hsinchu (TW); Chun-Yen Peng, Hsinchu (TW); Shih-Chen Chen, Hsinchu (TW); Hao-Chung Kuo, Hsinchu (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 614 days.

(21) Appl. No.: 18/046,158

(22) Filed: Oct. 13, 2022

(65) Prior Publication Data

US 2024/0047630 A1 Feb. 8, 2024

(30) Foreign Application Priority Data

Aug. 2, 2022 (TW) ................... 111129031

(51) Int. Cl.
*H10H 20/856* (2025.01)
*H01L 25/075* (2006.01)
*H10H 20/851* (2025.01)

(52) U.S. Cl.
CPC ....... *H10H 20/856* (2025.01); *H01L 25/0753* (2013.01); *H10H 20/8512* (2025.01)

(58) Field of Classification Search
CPC ............. H10H 20/856; H10H 20/8512; H10H 20/8513; H01L 25/0753
See application file for complete search history.

(56) References Cited

U.S. PATENT DOCUMENTS

2021/0183301 A1* 6/2021 Choi ................... H10H 29/142

FOREIGN PATENT DOCUMENTS

| CN | 106206889 A | 12/2016 |
|---|---|---|
| CN | 209561861 U | 10/2019 |
| CN | 209981278 U | 1/2020 |
| CN | 112447888 A | 3/2021 |
| CN | 114530532 A | 5/2022 |
| CN | 112234078 B | 11/2022 |
| KR | 20090121057 A | 11/2009 |
| TW | 202215680 A | 4/2022 |
| TW | 202220205 A | 5/2022 |
| TW | 202220230 A | 5/2022 |

* cited by examiner

*Primary Examiner* — Charles S Chang
(74) *Attorney, Agent, or Firm* — CKC & Partners Co., LLC

(57) ABSTRACT

A micro LED display device includes a light emitting layer, a color conversion layer located on a light emitting surface of the light emitting layer, and a Bragg reflection element located on the color conversion layer. The Bragg reflection element includes a plurality of layer pairs. Each of the layer pairs includes at least one first layer and at least one second layer alternately stacked. The layer pairs include a top layer pair, a bottom layer pair and a plurality of middle layer pairs between the top layer pair and the bottom layer pair. A thickness of the first layer of each of the middle layer pairs is smaller than a thickness of the second layer of each of the middle layer pairs. A refractive index of the first layer is greater than a refractive index of the second layer.

20 Claims, 7 Drawing Sheets

MICRO LED DISPLAY DEVICE

CROSS-REFERENCE TO RELATED APPLICATION

This application claims priority to Taiwan Application Serial Number 111129031, filed Aug. 2, 2022, which is herein incorporated by reference in its entirety.

BACKGROUND

Technical Field

The present disclosure relates to a micro LED display device.

Description of Related Art

The micro light emitting diode (micro LED) display device is a high-resolution display device in which the size of the LED is further reduced. The micro LED display device allows for a high immersion experience in virtual reality (VR) and provides for high brightness requirements against ambient light in augmented reality (AR). The micro LED display device is superior to the currently used LCD technology and organic light emitting diode (OLED) technology in terms of lifetime, response time, color saturation, pixel density, and energy efficiency. However, the current micro LED display device has the problem of insufficient luminous efficiency. For example, there is a considerable difference between the converted light and the original light with the current micro LED display device, resulting in reduced brightness.

Accordingly, one of the goals of research for the industry relates to providing a micro LED display device which can improve the problems mentioned above.

SUMMARY

One aspect of the present disclosure is a micro LED display device.

According to some embodiments of the present disclosure, a micro LED display device includes a light emitting layer, a color conversion layer located on a light emitting surface of the light emitting layer, and a first Bragg reflection element located on the color conversion layer. The first Bragg reflection element includes a plurality of layer pairs. Each of the layer pairs includes at least one first layer and at least one second layer alternately stacked. The layer pairs include a top layer pair, a bottom layer pair and a plurality of middle layer pairs between the top layer pair and the bottom layer pair. A thickness of the first layer of each of the middle layer pairs is smaller than a thickness of the second layer of each of the middle layer pairs. A refractive index of the first layer is greater than a refractive index of the second layer.

In some embodiments, the thickness of the first layer of each of the middle layer pairs is less than $\lambda/4n_1$ and the thickness of the second layer of each of the middle layer pairs is greater than $\lambda/4n_2$, wherein $\lambda$ is an emission wavelength of the light emitting layer, $n_1$ is the refractive index of the first layer, and $n_2$ is the refractive index of the second layer.

In some embodiments, a sum of a thickness of the first layer of the top layer pair and a thickness of the second layer of the top layer pair is smaller than a sum of the thickness of the first layer and the thickness of the second layer of each of the middle layer pairs.

In some embodiments, a sum of a thickness of the first layer of the bottom layer pair and a thickness of the second layer of the bottom layer pair is smaller than a sum of the thickness of the first layer and the thickness of the second layer of each of the middle layer pairs.

In some embodiments, a sum of a thickness of the first layer of the top layer pair and a thickness of the second layer of the top layer pair is greater than a sum of a thickness of the first layer of the bottom layer pair and a thickness of the second layer of the bottom layer pair.

In some embodiments, a thickness of the first layer of the top layer pair is greater than a thickness of the first layer of the bottom layer pair.

In some embodiments, a thickness of the second layer of the top layer pair is greater than a thickness of the second layer of the bottom layer pair.

In some embodiments, the light emitting layer includes a plurality of ultraviolet LEDs, and the ultraviolet LEDs are configured to emit ultraviolet light respectively, wherein the color conversion layer includes a red wavelength conversion material, a green wavelength conversion material and a blue wavelength conversion material that are corresponding to the ultraviolet LEDs respectively, such that the ultraviolet lights are converted into a red light, a green light and a blue light respectively.

In some embodiments, the micro LED display device further includes a second Bragg reflection element disposed on a surface opposite to the light emitting surface of the light emitting layer. The second Bragg reflection element includes a plurality of layer pairs, each of the layer pairs includes at least one first layer and at least one second layer alternately stacked, and the layer pairs includes a top layer pair, a bottom layer pair, and a plurality of middle layer pairs located between the top layer pair and the bottom layer pair. A refractive index of the first layer is greater than a refractive index of the second layer.

In some embodiments, the layer pairs of the second Bragg reflection element are respectively the same as the layer pairs of the first Bragg reflection element.

In some embodiments, each of the first layers of the second Bragg reflection element has the same thickness, and each of the second layers of the second Bragg reflection element has the same thickness.

In some embodiments, the top layer pair of the second Bragg reflection element is connected to the light emitting layer.

In some embodiments, the bottom layer pair of the first Bragg reflection element is connected to the color conversion layer.

Another aspect of the present disclosure is a micro LED display device.

According to some embodiments of the present disclosure, a micro LED display device includes a light emitting layer, a color conversion layer located on a light emitting surface of the light emitting layer, and a Bragg reflection element located on the color conversion layer. The Bragg reflection element includes a plurality of layer pairs. Each of the layer pairs includes at least one first layer and at least one second layer alternately stacked. The layer pairs include a top layer pair, a bottom layer pair and a plurality of middle layer pairs between the top layer pair and the bottom layer pair. A thickness of the top layer pair is smaller than a thickness of each of the middle layer pairs. A refractive index of the first layer is greater than a refractive index of the second layer.

In some embodiments, a thickness of the first layer of each of the middle layer pairs is less than $\lambda/4n_1$ and a thickness of the second layer of each of the middle layer pairs is greater than $\lambda/4n_2$, wherein $\lambda$ is an emission wavelength of the light emitting layer, $n_1$ is the refractive index of the first layer, and $n_2$ is the refractive index of the second layer.

In some embodiments, the thickness of the bottom layer pair is smaller than a thickness of each of the middle layer pairs.

In some embodiments, the thickness of the top layer pair is greater than a thickness of the bottom layer pair.

Another aspect of the present disclosure is a micro LED display device.

According to some embodiments of the present disclosure, a micro LED display device includes a light emitting layer, a color conversion layer located on a light emitting surface of the light emitting layer, and a first Bragg reflection element located on the color conversion layer. The first Bragg reflection element includes a plurality of layer pairs. The layer pairs include a top layer pair, a bottom layer pair and a plurality of middle layer pairs between the top layer pair and the bottom layer pair. Each of the middle layer pairs has the same thickness that is different from a thickness of the top layer pair and different from a thickness of the bottom layer pair. The bottom layer pair is connected to the color conversion layer.

In some embodiments, each of the layer pairs includes at least one first layer and at least one second layer alternately stacked, and a refractive index of the first layer is greater than a refractive index of the second layer.

In some embodiments, the micro LED display device further includes a second Bragg reflection element connected to the light emitting layer.

In the aforementioned embodiments, the micro LED display device of the present disclosure includes the Bragg reflection element, and the thickness of the Bragg reflection element is adjusted to increase transmission efficiency of visible light and the light filtering effect of ultraviolet light. As a result, increased luminous efficiency of the micro LED display device can be achieved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
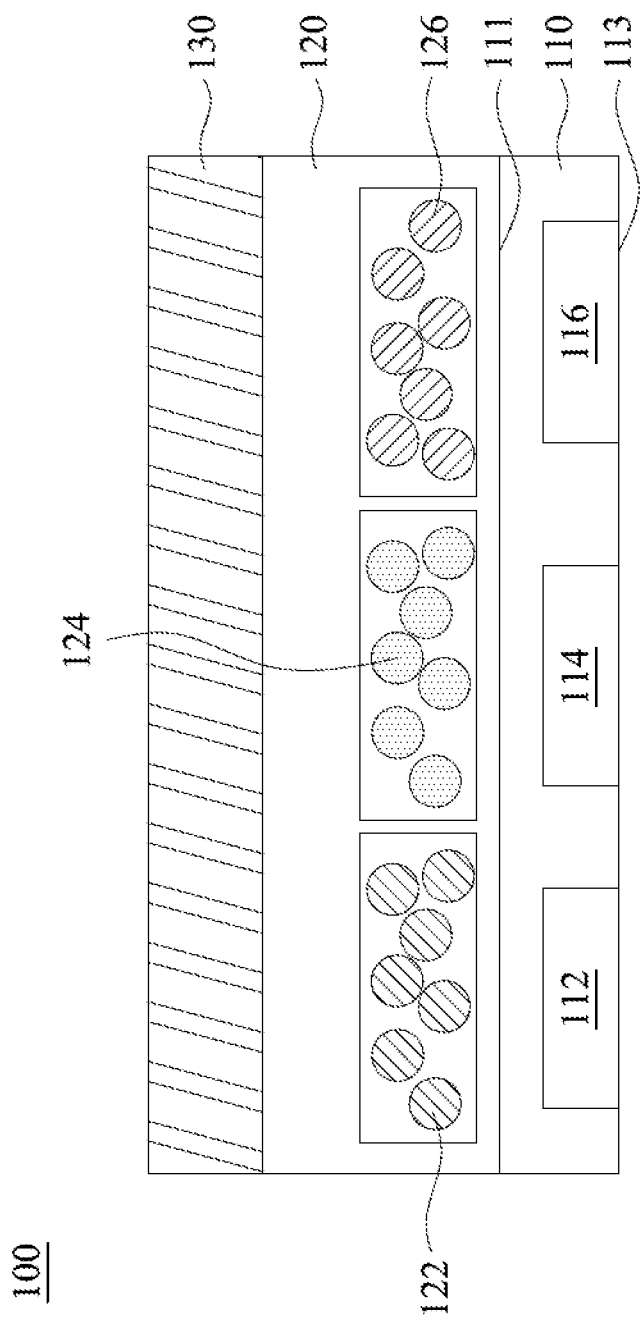
FIG. 1 is a schematic view of a micro LED display device in accordance with one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

FIG. 1 is a schematic view of a micro light emitting diode (LED) display device 100 in accordance with one embodiment of the present disclosure. The micro LED display device 100 includes a light emitting layer 110, a color conversion layer 120 and a Bragg reflection element 130. The light emitting layer 110 includes ultraviolet micro LEDs 112, 114 and 116. The color conversion layer 120 is located on a light emitting surface 111 of the light emitting layer 110. The Bragg reflection element 130 is located on the color conversion layer 120.

Figure 2:
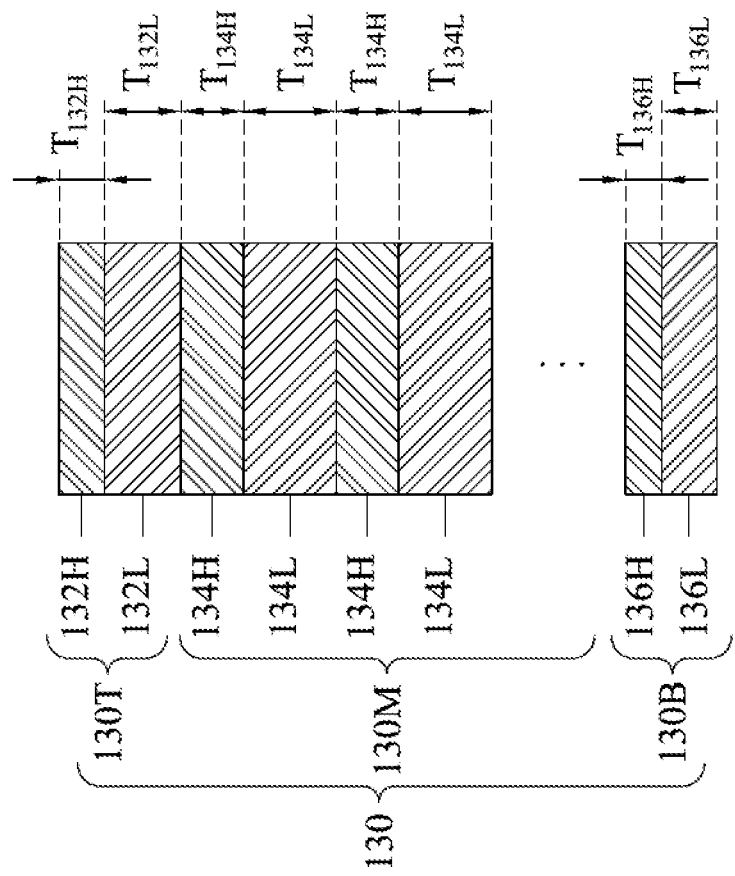
FIG. 2 is a partially enlarged view of the micro LED display device of FIG. 1.

FIG. 2 is a partially enlarged view of the Bragg reflection element 130 of FIG. 1. The Bragg reflection element 130 includes a plurality of layer pairs. Each of the layer pairs includes at least one first layer and at least one second layer alternately stacked, in which a refractive index of the first layers is greater than a refractive index of the second layers. In greater detail, the layer pairs of the Bragg reflection element 130 include a top layer pair 130T, a bottom layer pair 130B and a plurality of middle layer pairs 130M between the top layer pair 130T and the bottom layer pair 130B. In some embodiments, a number of the middle layer pairs 130M is six (i.e., the Bragg reflection element 130 includes 8 pairs of alternately stacked first layers and second layers); however, it should be understood that the aforementioned number is merely for illustrative purposes and does not intend to limit the present disclosure. The top layer pair 130T includes a first layer 132H and a second layer 132L below the first layer 132H, and the bottom layer pair 130B includes a first layer 136H and a second layer 136L below the first layer 136H. Each of the middle layer pairs 130M includes a first layer 134H and a second layer 134L below the first layer 134H. A thickness T134H of the first layer 134H of each of the middle layer pairs 130M is smaller than a thickness T134L of the second layer 134L of each of the middle layer pairs 130M. In some embodiments, the thickness T134H of the first layer 134H of each of the middle layer pairs 130M is less than $\lambda/4n1$ and the thickness T134L of the second layer 134L of each of the middle layer pairs 130M is greater than $\lambda/4n2$, in which $\lambda$ is an emission wavelength of the light emitting layer 110, n1 is the refractive index of the first layers (i.e., high refractivity material layers), n2 is the refractive index of the second layers (i.e., low refractivity material layers), and n2 is greater than n1. With the above-mentioned thickness configuration of the Bragg reflection element 130, a peak of the respective standing wave can be kept away from a junction position of the first layer and the second layer, thereby effectively reducing ripples caused by high-order interference. As such, the transmission efficiency of visible light and the light filtering effect of ultraviolet light can be increased, and the light purity can be improved, thereby increasing the luminous efficiency of the micro LED display device 100. Further, the micro LED display device 100 of the present disclosure includes the Bragg reflection element 130 that can replace filters, such that the effect of reducing the size (i.e., occupied volume) can be achieved. That is, the micro LED display device 100 does not include filters.

Each of the middle layer pairs 130M has the same thickness. For example, the thickness $T_{134H}$ of the first layer 134H of one of the middle layer pairs 130M is the same as the thickness $T_{134H}$ of the first layer 134H of another one of the middle layer pairs 130M, and the thickness $T_{134L}$ of the second layer 134L of one of the middle layer pairs 130M is the same as the thickness $T_{134L}$ of the second layer 134L of another one of the middle layer pairs 130M, such that one of the middle layer pairs 130M has the same thickness as any another one of the middle layer pairs 130M. In some embodiments, for each of the middle layer pairs 130M, a sum of the thickness $T_{134H}$ of the first layer 134H and the thickness $T_{134L}$ of the second layer 134L is substantially equal to a sum of $\lambda/4n_1$ and $\lambda/4n_2$.

In some embodiments, the thickness of the top layer pair 130T is smaller than the thickness of each of the middle layer pairs 130M. That is, a sum (thickness sum) of the thickness $T_{132H}$ of the first layer 132H of the top layer pair 130T and the thickness $T_{132L}$ of the second layer 132L of the top layer pair 130T is smaller than a sum of the thickness $T_{134H}$ of the first layer 134H and the thickness $T_{134L}$ of the second layer 134L of each of the middle layer pairs 130M. In greater detail, the thickness $T_{132H}$ of the first layer 132H of the top layer pair 130T is smaller than the thickness $T_{134H}$ of the first layer 134H of each of the middle layer pairs 130M, and the thickness $T_{132L}$ of the second layer 132L of the top layer pair 130T is smaller than the thickness $T_{134L}$ of the second layer 134L of each of the middle layer pairs 130M. Therefore, the Bragg reflection element 130 may eliminate the overall reflection of the sideband, thereby maintaining high transmissivity of visible light and improving the reflectivity of ultraviolet light. For example, the transmissivity of wavelengths greater than 455 nm (e.g., including visible light wavelength) is higher than 90%, and the transmissivity of wavelengths smaller than 455 nm (e.g., including ultraviolet light wavelength) is smaller than 10%. Therefore, ultraviolet light (or ultraviolet light wavelength) can be effectively filtered. The thickness $T_{132H}$ of the first layer 132H of the top layer pair 130T may be in a range of about 19 nm to about 25 nm (e.g., 22 nm), and the thickness $T_{132L}$ of the second layer 132L of the top layer pair 130T may be in a range of about 50 nm to about 56 nm (e.g., 53 nm). The thickness $T_{134H}$ of the first layer 134H of each of the middle layer pairs 130M may be in a range of about 37 nm to about 43 nm (e.g., 40 nm), and the thickness $T_{134L}$ of the second layer 134L of each of the middle layer pairs 130M may be in a range of about 57 nm to about 63 nm (e.g., 60 nm). In some embodiments, a ratio of the thickness $T_{132H}$ of the first layer 132H of the top layer pair 130T to the thickness $T_{134H}$ of the first layer 134H of each of the middle layer pairs 130M may be in a range of about 0.5 to about 0.6 (e.g., 0.55). A ratio of the thickness $T_{132L}$ of the second layer 132L of the top layer pair 130T to the thickness $T_{134L}$ of the second layer 134L of each of the middle layer pairs 130M may be in a range of about 0.85 to about 0.95 (e.g., 0.89). In some embodiments, the thickness $T_{132H}$ of the first layer 132H of the top layer pair 130T is smaller than $\lambda/4n_1$ and the thickness $T_{132L}$ of the second layer 132L of the top layer pair 130T is smaller than $\lambda/4n_2$.

In some embodiments, the thickness of the bottom layer pair 130B is smaller than the thickness of each of the middle layer pairs 130M. That is, a sum of the thickness $T_{136H}$ of the first layer 136H of the bottom layer pair 130B and the thickness $T_{136L}$ of the second layer 136L of the bottom layer pair 130B is smaller than the sum of the thickness $T_{134H}$ of the first layer 134H and the thickness $T_{134L}$ of the second layer 134L of each of the middle layer pairs 130M. In greater detail, the thickness $T_{136H}$ of the first layer 136H of the bottom layer pair 130B is smaller than the thickness $T_{134H}$ of the first layer 134H of each of the middle layer pairs 130M, and the thickness $T_{136L}$ of the second layer 136L of the bottom layer pair 130B is smaller than the thickness $T_{134L}$ of the second layer 134L of each of the middle layer pairs 130M. Therefore, the Bragg reflection element 130 may eliminate the overall reflection of the sideband, thereby maintaining high transmissivity of visible light and improving the reflectivity of ultraviolet light. The thickness $T_{136H}$ of the first layer 136H of the bottom layer pair 130B may be in a range of about 5 nm to about 10 nm (e.g., 7 nm), and the thickness $T_{136L}$ of the second layer 136L may be in a range of about 30 nm to about 35 nm (e.g., 33 nm). In some embodiments, a ratio of the thickness $T_{136H}$ of the first layer 136H of the bottom layer pair 130B to the thickness $T_{134H}$ of the first layer 134H of each of the middle layer pairs 130M may be in a range of about 0.15 to about 0.25 (e.g., 0.19). A ratio of the thickness $T_{136L}$ of the second layer 136L of the bottom layer pair 130B to the thickness $T_{134L}$ of the second layer 134L of each of the middle layer pairs 130M may be in a range of about 0.5 to about 0.6 (e.g., 0.55). In some embodiments, the thickness $T_{136H}$ of the first layer 136H of the bottom layer pair 130B is smaller than $\lambda/4n_1$ and the thickness $T_{136L}$ of the second layer 136L is smaller than $\lambda/4n_2$.

In some embodiments, the thickness of the top layer pair 130T is greater than the thickness of the bottom layer pair 130B. That is, the sum of the thickness $T_{132H}$ of the first layer 132H of the top layer pair 130T and the thickness $T_{132L}$ of the second layer 132L of the top layer pair 130T is greater than the sum of the thickness $T_{136H}$ of the first layer 136H of the bottom layer pair 130B and the thickness $T_{136L}$ of the second layer 136L of the bottom layer pair 130B. In greater detail, the thickness $T_{132H}$ of the first layer 132H of the top layer pair 130T is greater than the thickness $T_{136H}$ of the first layer 136H of the bottom layer pair 130B, and the thickness $T_{132L}$ of the second layer 132L of the top layer pair 130T is greater than the thickness $T_{136L}$ of the second layer 136L of the bottom layer pair 130B. Therefore, the Bragg reflection element 130 can maintain high transmissivity of visible light and improve the reflectivity of ultraviolet light. In some embodiments, a ratio of the thickness $T_{132H}$ of the first layer 132H of the top layer pair 130T to the thickness $T_{136H}$ of the first layer 136H of the bottom layer pair 130B is in a range of about 2.7 to about 3.3 (e.g., 3). A ratio of the thickness $T_{132L}$ of the second layer 132L of the top layer pair 130T to the thickness $T_{136L}$ of the second layer 136L of the bottom layer pair 130B may be in a range of about 1.3 to about 1.9 (e.g., 1.6).

In some embodiments, the first layers (i.e., including the first layer 132H, the first layer 134H, and the first layer 136H) of the Bragg reflection element 130 include titanium oxide ($TiO_2$) or other suitable materials. The second layers (i.e., including the second layer 132L, the second layer 134L and the second layer 136L) of the Bragg reflection element 130 include silicon oxide (SiO$_2$) or other suitable materials. In some embodiments, the Bragg reflection element 130 includes a first transparent layer and a second transparent layer (not shown), which are respectively located on the top layer pair 130T and the bottom layer pair 130B, in which the first transparent layer and the second transparent layer are made of glass. In some embodiments, the bottom layer pair 130B of the Bragg reflection element 130 is connected to the color conversion layer 120. Specifically, the second layer 136L of the bottom layer pair 130B of the Bragg reflection element 130 is connected to the color conversion layer 120.

In some embodiments, the micro LED display device 100 is applied to a large area and/or high pixel display devices, a wearable display device, an augmented reality (AR) device, a virtual reality (VR) device, a mixed reality (MR) device, a vehicle display device, a flexible electronic equipment display device, a visible light communication device, and the like. In some embodiments of the present disclosure, the light emitting layer 110 includes micro light emitting diodes (micro LEDs) that contain aluminum gallium nitride (AlGaN). "Micro LED" refers to the size of the diode chip miniaturized to the micron scale (e.g., below 50 microns), without a sapphire substrate, and the miniaturized diode chip is arrayed to become a display pixel that can be controlled and driven individually. In some embodiments, the light emitting layer 110 includes light emitting diodes (LEDs), organic light emitting diodes (OLEDs), laser discs, semiconductor lasers, or other suitable light emitting elements.

Referring to FIG. 1 and FIG. 2, the light emitting layer 110 includes the ultraviolet micro LEDs 112, 114 and 116 located at intervals. In other words, the light emitting layer 110 includes a plurality of pixels, each of the pixels includes three ultraviolet micro LEDs 112, 114 and 116, and the ultraviolet micro LEDs 112, 114 and 116 are configured to respectively emit ultraviolet lights toward the color conversion layer 120. The color conversion layer 120 includes a material having the ability to change/convert wavelengths. In greater detail, the color conversion layer 120 includes a first portion, a second portion and a third portion located at intervals, in which the first portion includes a red wavelength conversion material 122, the second portion includes a green wavelength conversion material 124 and the third portion includes a blue wavelength conversion material 126. The red wavelength conversion material 122 corresponds (e.g., aligned in position) to the ultraviolet micro LED 112, the green wavelength conversion material 124 corresponds (e.g., aligned in position) to the ultraviolet micro LED 114, and the blue wavelength conversion material 126 corresponds (e.g., aligned in position) to the ultraviolet micro LED 116. For example, the red wavelength conversion material 122 is at least partially vertically aligned to the ultraviolet micro LED 112, the green wavelength conversion material 124 is at least partially vertically aligned to the ultraviolet micro LED 114, and the blue wavelength conversion material 126 is at least partially vertically aligned to the ultraviolet micro LED 116. The red wavelength conversion material 122 includes red quantum dots or red fluorescent powder, or a combination of red fluorescent powder and red quantum dots. The red wavelength conversion material 122 may be configured to absorb ultraviolet light of the ultraviolet micro LED 112, convert the ultraviolet light into red light, and emit red light toward the Bragg reflection element 130. The green wavelength conversion material 124 includes green quantum dots or green fluorescent powder, or a combination of green fluorescent powder and green quantum dots. The green wavelength conversion material 124 may be configured to absorb ultraviolet light of the ultraviolet micro LED 114, convert the ultraviolet light into green light, and emit green light toward the Bragg reflection element 130. The blue wavelength conversion material 126 includes blue quantum dots or blue fluorescent powder, or a combination of blue fluorescent powder and blue quantum dots. The blue wavelength conversion material 126 may be configured to absorb ultraviolet light of the ultraviolet micro LED 116, convert the ultraviolet light into blue light, and emit blue light toward the Bragg reflection element 130.

In some embodiments, a portion (e.g., about 90%) of the ultraviolet light of the ultraviolet micro LEDs 112, 114, and 116 is converted into visible light by the respective red wavelength conversion material 122, the green wavelength conversion material 124 and the blue wavelength conversion material 126 of the color conversion layer 120, while the remaining portion (e.g., about 10%) of the ultraviolet light is not converted and remains ultraviolet light. The Bragg reflection element 130 is configured to allow visible light to pass therethrough and reflect ultraviolet light. Further, ultraviolet light reflected by the Bragg reflection element 130 is directed toward the color conversion layer 120, and the wavelength conversion materials (the red wavelength conversion material 122, the green wavelength conversion material 124, and the blue wavelength conversion material 126) in the color conversion layer 120 may be configured to convert the ultraviolet light into visible light again. Therefore, the Bragg reflection element 130 can have the effects of increasing the intensity of visible light and reducing the transmission of ultraviolet light.

Figure 3:
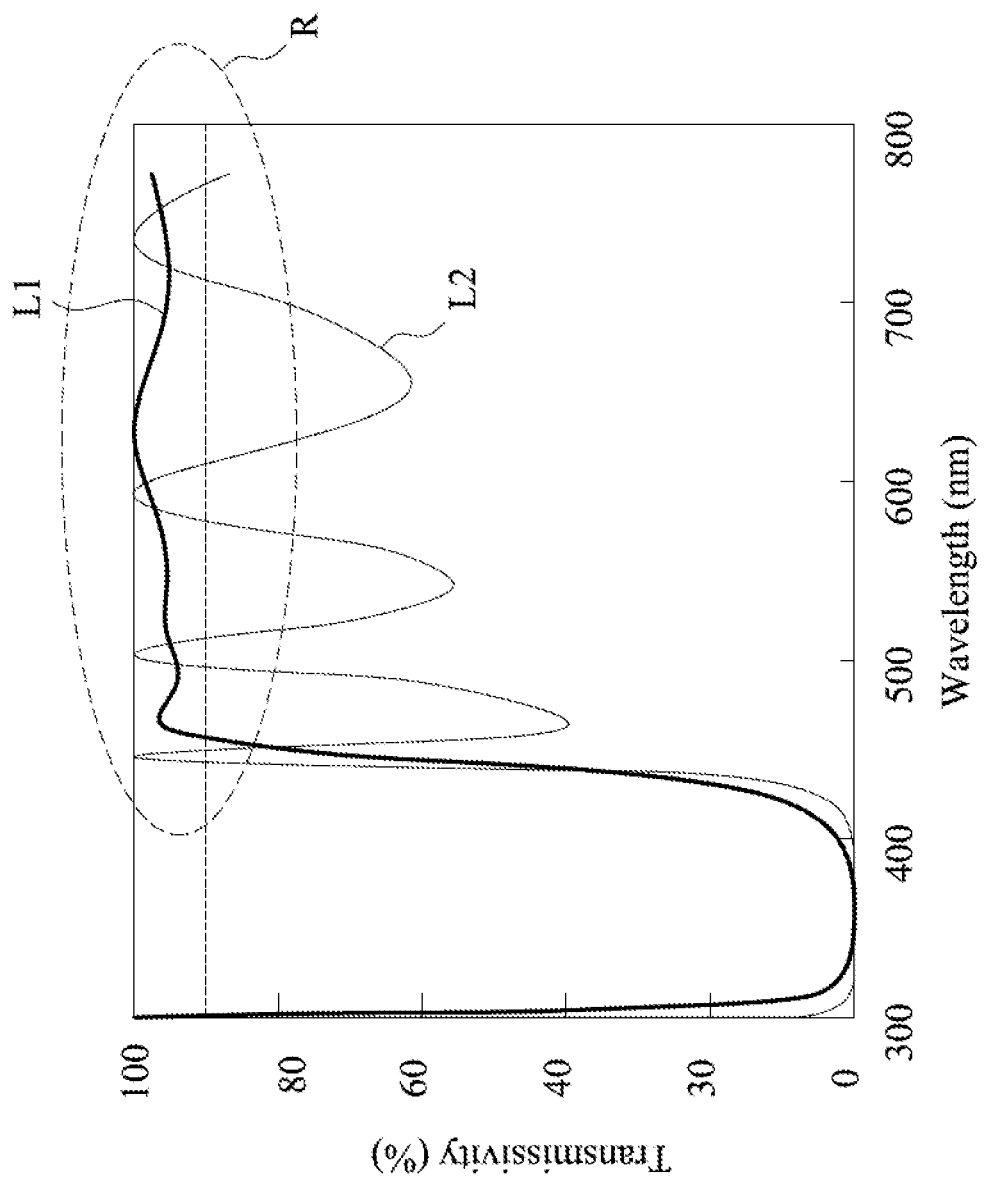
FIG. 3 is a graph of a transmissivity and a light wavelength in accordance with some embodiments of the present disclosure.

FIG. 3 is a graph of a light wavelength and light transmissivity through the Bragg reflection element 130 in accordance with some embodiments of the present disclosure. Referring to FIG. 1 and FIG. 3, if the Bragg reflection element 130 has the structure shown in FIG. 2, when visible light (i.e., red light, green light, and/or blue light) passes through the Bragg reflection element 130, the visible light (e.g., the wavelength greater than about 455 nm in a region R) may have high transmissivity and the transmissivity remains greater than 90%, as shown in curve L1. In contrast, if the Bragg reflection element does not have the structure shown in FIG. 2, when visible light passes through the Bragg reflection element, the transmissivity of the visible light (e.g., the wavelength greater than about 455 nm in the region R) would be inconsistent and thus a portion of the visible light would not be transmitted, as shown in curve L2. Therefore, the Bragg reflection element 130 of the present disclosure can achieve the technical effect of increasing the transmission efficiency of visible light.

Figure 4:
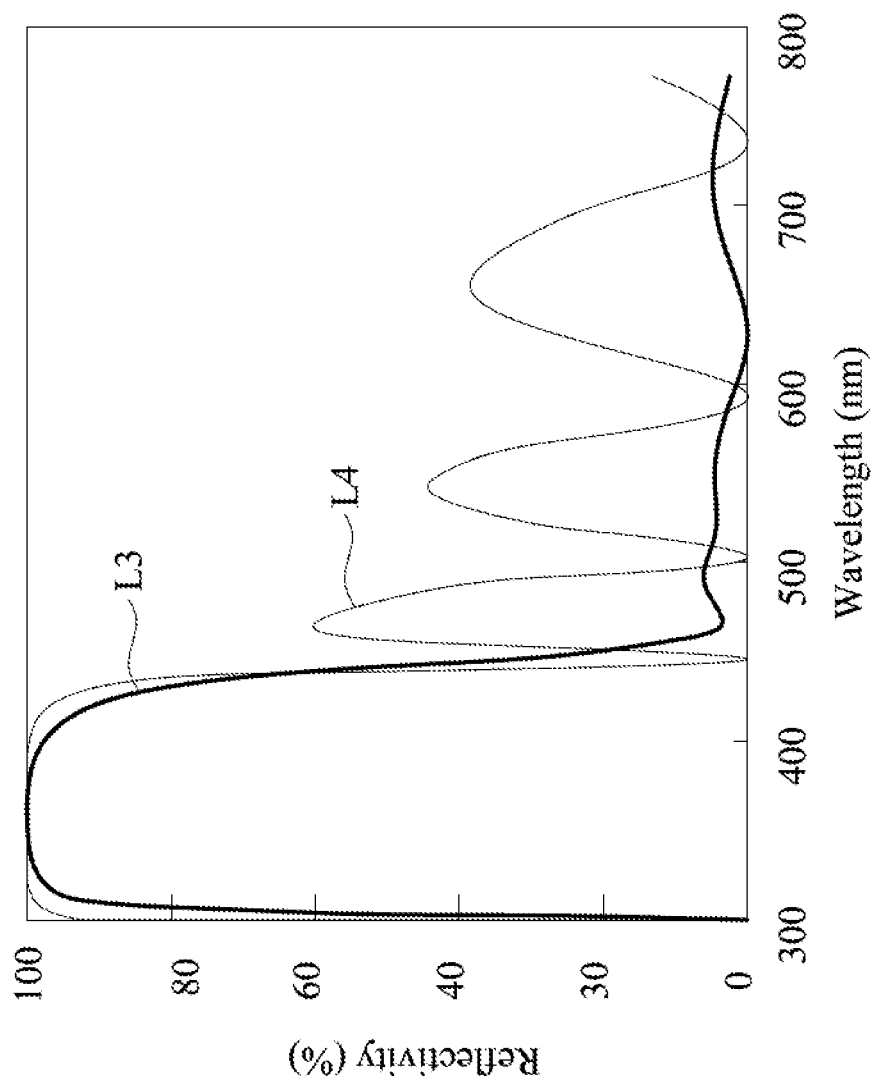
FIG. 4 is a graph of a reflectivity and a light wavelength in accordance with some embodiments of the present disclosure.

FIG. 4 is a graph of a light wavelength and a light reflectivity through the Bragg reflection element 130 in accordance with some embodiments of the present disclosure. Referring to FIG. 1 and FIG. 4, if the Bragg reflection element 130 has the structure shown in FIG. 2, when the remaining ultraviolet light passes through the Bragg reflection element 130 from the color conversion layer 120, the ultraviolet light may have high reflectivity, as shown in curve L3. In contrast, if the Bragg reflection element does not have the structure shown in FIG. 2, when ultraviolet light passes through the Bragg reflection element, the reflectivity of the ultraviolet light would be inconsistent and thus a portion of the ultraviolet light would not be filtered, and in this case, the problem of unexpected reflection (i.e., additional interference ripples) would occur, as shown in curve L4. Therefore, the Bragg reflection element 130 of the present disclosure can achieve the technical effect of reflecting/filtering ultraviolet light.

Figure 5:
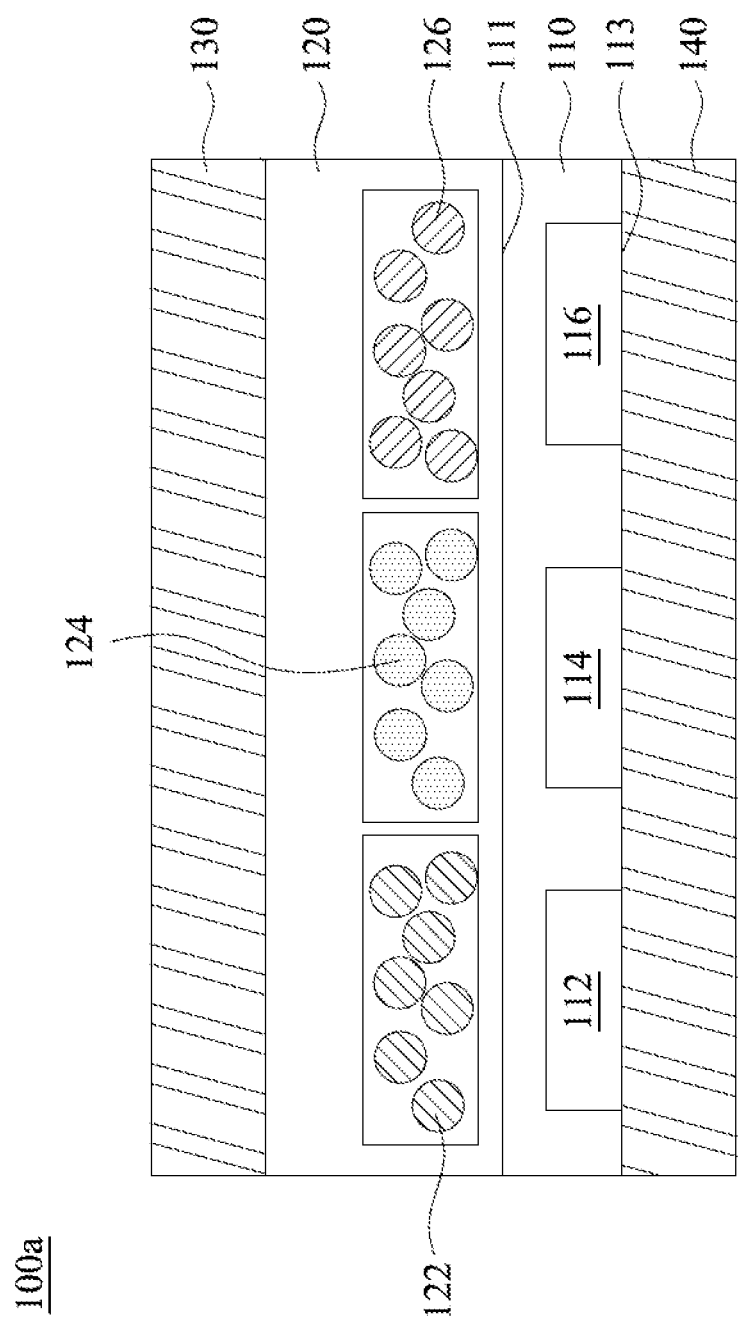
FIG. 5 is a schematic view of a micro LED display device in accordance with another embodiment of the present disclosure.

FIG. 5 is a schematic view of a micro LED display device 100a in accordance with another embodiment of the present disclosure. The micro LED display device 100a of FIG. 5 is substantially the same as the micro LED display device 100 of FIG. 1, and the difference is that the micro LED display device 100a of this embodiment further includes another Bragg reflection element 140. The Bragg reflection element 140 is located on a surface 113 opposite to the light emitting surface 111 of the light emitting layer 110, such that the light emitting layer 110 is located between the color conversion layer 120 and the Bragg reflection element 140. The Bragg reflection element 140 can prevent the light emitted from the light emitting layer 110 from escaping. The Bragg reflection element 140 includes a plurality of layer pairs, and each of the layer pairs includes at least one first layer and at least one second layer alternately stacked. The layer pairs include a top layer pair, a bottom layer pair, and a plurality of middle layer pairs located between the top layer pair and the bottom layer pair, in which a refractive index of the first layers is greater than a refractive index of the second layers. The top layer pair of the Bragg reflection element 140 is connected to the light emitting layer 110. For example, the first layer of the top layer pair of the Bragg reflection element 140 is connected to the light emitting layer 110. In some embodiments, the Bragg reflection element 140 has a structure similar to or the same as the structure of the Bragg reflection element 130 (e.g., a similar or the same thickness relationship). Specifically, the layer pairs of the Bragg reflection element 140 are respectively the same as the layer pairs of the Bragg reflection element 130. The Bragg reflection element 140 includes a top layer pair, a bottom layer pair, and middle layer pairs located between the top layer pair and the bottom layer pair, which are the same as the top layer pair 130T, the bottom layer pair 130B, and the middle layer pairs 130M of the Bragg reflection element 130 (as shown in FIG. 2). The aforementioned detailed structure is similar to or the same as the structure shown in FIG. 2, and therefore, a description in this regard will not be repeated hereinafter. In other embodiments, the Bragg reflection element 140 has a structure different from that of the Bragg reflection element 130. Specifically, each of the first layers of the Bragg reflection element 140 has the same thickness, and each of the second layers of the Bragg reflection element 140 has the same thickness. For example, the thickness of each of the first layers is $\lambda/4n_1$ and the thickness of each of the second layers is $\lambda/4n_2$, in which A is the emission wavelength of the light emitting layer 110, $n_1$ is the refractive index of the first layers, $n_2$ is the refractive index of the second layers, and $n_1$ is greater than $n_2$.

Figure 6:
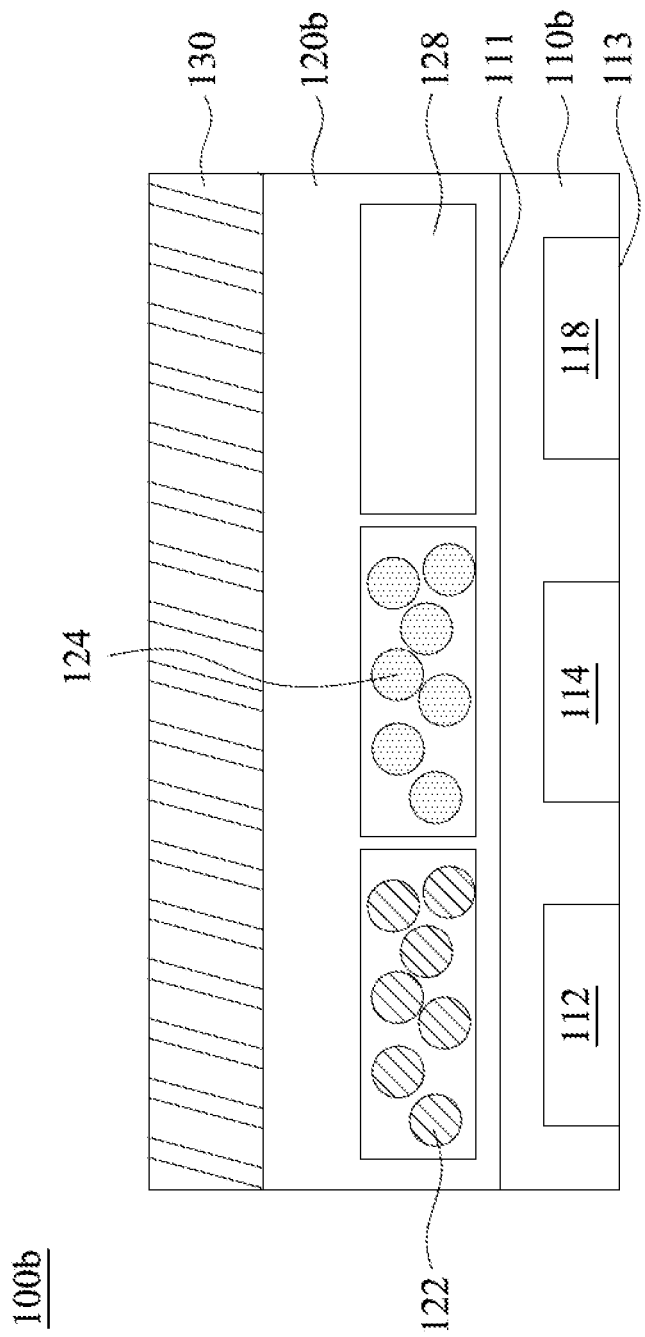
FIG. 6 is a schematic view of a micro LED display device in accordance with another embodiment of the present disclosure.

FIG. 6 is a schematic view of a micro LED display device 100b in accordance with another embodiment of the present disclosure. The micro LED display device 100b of FIG. 6 is substantially the same as the micro LED display device 100 of FIG. 1, and the difference is the configuration of the light emitting layer 110b and the color conversion layer 120b of the micro LED display device 100b. In particular, the light emitting layer 110b includes a plurality of pixels, and each of the pixels includes two ultraviolet micro LEDs 112 and 114 and a blue micro LED 118. The color conversion layer 120b includes a first portion, a second portion and a third portion 128 located at intervals, in which the first portion includes the red wavelength conversion material 122 corresponding (e.g., aligned in position or at least partially vertically aligned) to the ultraviolet micro LED 112 and the second portion includes the green wavelength conversion material 124 corresponding (e.g., aligned in position or at least partially vertically aligned) to the ultraviolet micro LED 114, and the red wavelength conversion material 122 and the green wavelength conversion material 124 are configured to convert ultraviolet light emitted by the ultraviolet micro LEDs 112 and 114 into red light and green light, respectively. The third portion 128 of the color conversion layer 120b corresponding (e.g., aligned in position or at least partially vertically aligned) to the blue micro LED 118 does not contain a wavelength conversion material, such that blue light emitted by the blue micro LED 118 passes through the third portion 128 of the color conversion layer 120b without being converted. The micro LED display device 100b has similar technical effects as the micro LED display device 100 of FIG. 1, including effectively reducing ripples caused by high-order interference, and increasing the transmission efficiency of visible light and the light filtering effect of ultraviolet light.

Figure 7:
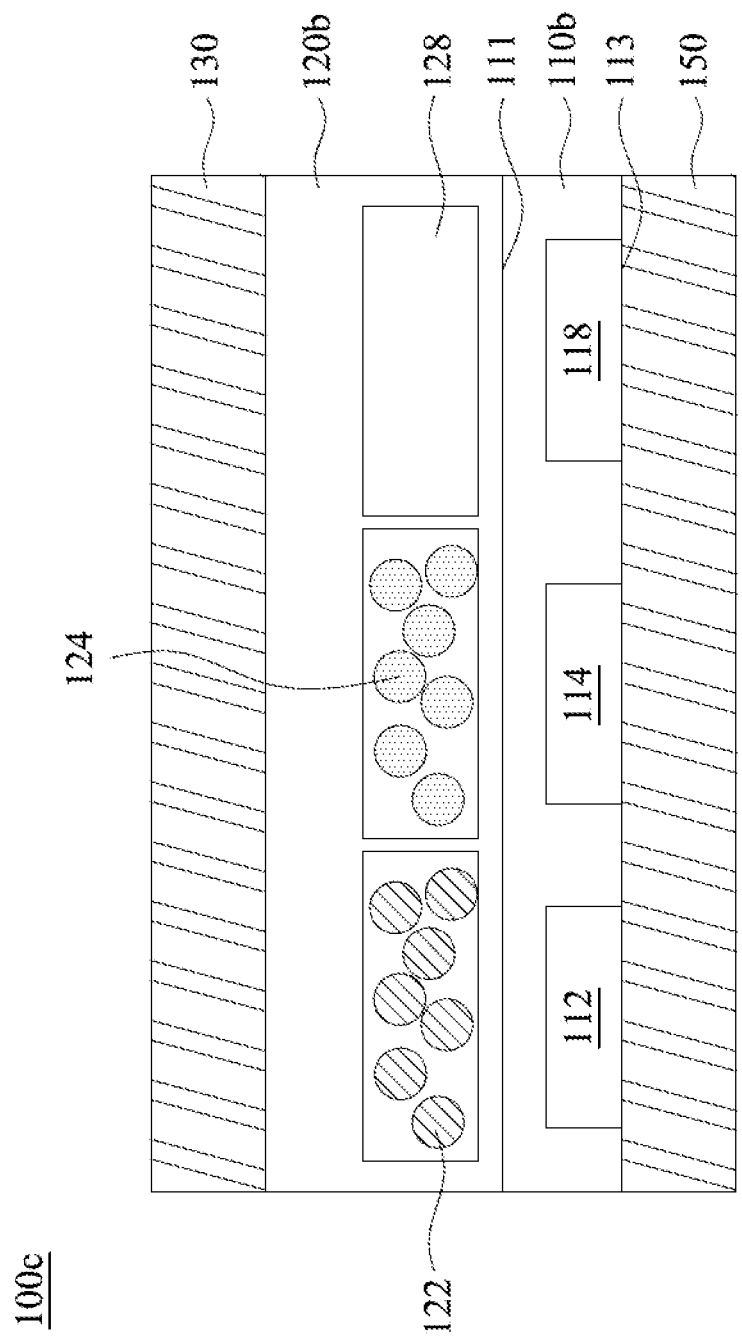
FIG. 7 is a schematic view of a micro LED display device in accordance with another embodiment of the present disclosure.

FIG. 7 is a schematic view of a micro LED display device 100c in accordance with another embodiment of the present disclosure. The micro LED display device 100c of FIG. 7 is substantially the same as the micro LED display device 100b of FIG. 6, and the difference is that the micro LED display device 100c further includes another Bragg reflection element 150. The Bragg reflection element 150 is located on the surface 113 opposite to the light emitting surface 111 of the light emitting layer 110b, such that the light emitting layer 110b is located between the color conversion layer 120b and the Bragg reflection element 150. The Bragg reflection element 150 can prevent light emitted from the light emitting layer 110b from escaping. The Bragg reflection element 150 includes a plurality of layer pairs, and each of the layer pairs includes at least one first layer and at least one second layer alternately stacked. The layer pairs include a top layer pair, a bottom layer pair, and a plurality of middle layer pairs located between the top layer pair and the bottom layer pair, in which a refractive index of the first layers is greater than a refractive index of the second layers. The top layer pair of the Bragg reflection element 150 is connected to the light emitting layer 110b. For example, the first layer of the top layer pair of the Bragg reflection element 150 is connected to the light emitting layer 110b. In some embodiments, the Bragg reflection element 150 has a structure similar to or the same as the structure of the Bragg reflection element 130 (e.g., a similar or the same thickness relationship). Specifically, the layer pairs of the Bragg reflection element 150 are respectively the same as the layer pairs of the Bragg reflection element 130. The Bragg reflection element 150 includes a top layer pair, a bottom layer pair, and middle layer pairs located between the top layer pair and the bottom layer pair, which are the same as the top layer pair 130T, the bottom layer pair 130B, and the middle layer pairs 130M of the Bragg reflection element 130 (as shown in FIG. 2). The aforementioned detailed structure is similar to or the same as the structure shown in FIG. 2, and therefore, a description in this regard will not be repeated hereinafter. In other embodiments, the Bragg reflection element 150 has a structure different from that of the Bragg reflection element 130. Specifically, each of the first layers of the Bragg reflection element 150 has the same thickness, and each of the second layers of the Bragg reflection element 150 has the same thickness. For example, the thickness of each of the first layers is $\lambda/4n_1$ and the thickness of each of the second layers is $\lambda/4n_2$, in which A is the emission wavelength of the light emitting layer 110b, $n_1$ is the refractive index of the first layers, $n_2$ is the refractive index of the second layers, and $n_1$ is greater than $n_2$.

In summary, the micro LED display device of the present disclosure includes the Bragg reflection element, and the thickness of the Bragg reflection element is adjusted to increase transmission efficiency of visible light and the light filtering effect of ultraviolet light. As a result, increased luminous efficiency of the micro LED display device can be achieved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A micro LED display device, comprising:
   a light emitting layer;
   a color conversion layer disposed on a light emitting surface of the light emitting layer; and
   a first Bragg reflection element disposed on the color conversion layer, the first Bragg reflection element comprising a plurality of layer pairs, each of the layer pairs comprising at least one first layer and at least one second layer alternately stacked, wherein the layer pairs comprise:
   a top layer pair;
   a bottom layer pair; and
   a plurality of middle layer pairs disposed between the top layer pair and the bottom layer pair, and a thickness of the first layer of each of the middle layer pairs is smaller than a thickness of the second layer of each of the middle layer pairs,
   wherein a refractive index of the first layer is greater than a refractive index of the second layer.

2. The micro LED display device of claim 1, wherein the thickness of the first layer of each of the middle layer pairs is smaller than $\lambda/4n_1$ and the thickness of the second layer of each of the middle layer pairs is greater than $\lambda/4n_2$, wherein $\lambda$ is an emission wavelength of the light emitting layer, $n_1$ is the refractive index of the first layer, and $n_2$ is the refractive index of the second layer.

3. The micro LED display device of claim 1, wherein a sum of a thickness of the first layer of the top layer pair and a thickness of the second layer of the top layer pair is smaller than a sum of the thickness of the first layer and the thickness of the second layer of each of the middle layer pairs.

4. The micro LED display device of claim 1, wherein a sum of a thickness of the first layer of the bottom layer pair and a thickness of the second layer of the bottom layer pair is smaller than a sum of the thickness of the first layer and the thickness of the second layer of each of the middle layer pairs.

5. The micro LED display device of claim 1, wherein a sum of a thickness of the first layer of the top layer pair and a thickness of the second layer of the top layer pair is greater than a sum of a thickness of the first layer of the bottom layer pair and a thickness of the second layer of the bottom layer pair.

6. The micro LED display device of claim 1, wherein a thickness of the first layer of the top layer pair is greater than a thickness of the first layer of the bottom layer pair.

7. The micro LED display device of claim 1, wherein a thickness of the second layer of the top layer pair is greater than a thickness of the second layer of the bottom layer pair.

8. The micro LED display device of claim 1, wherein the light emitting layer comprises a plurality of ultraviolet LEDs, and the ultraviolet LEDs are configured to emit ultraviolet lights respectively, wherein the color conversion layer comprises a red wavelength conversion material, a green wavelength conversion material and a blue wavelength conversion material that are corresponding to the ultraviolet LEDs respectively, such that the ultraviolet lights are converted into a red light, a green light and a blue light respectively.

9. The micro LED display device of claim 1, further comprising:
   a second Bragg reflection element disposed on a surface opposite to the light emitting surface of the light emitting layer, wherein the second Bragg reflection element comprises a plurality of layer pairs, each of the layer pairs comprises at least one first layer and at least one second layer alternately stacked, and the layer pairs comprise:
   a top layer pair;
   a bottom layer pair; and
   a plurality of middle layer pairs disposed between the top layer pair and the bottom layer pair, wherein a refractive index of the first layer is greater than a refractive index of the second layer.

10. The micro LED display device of claim 9, wherein the layer pairs of the second Bragg reflection element are respectively the same as the layer pairs of the first Bragg reflection element.

11. The micro LED display device of claim 9, wherein each of the first layers of the second Bragg reflection element has the same thickness, and each of the second layers of the second Bragg reflection element has the same thickness.

12. The micro LED display device of claim 9, wherein the top layer pair of the second Bragg reflection element is connected to the light emitting layer.

13. The micro LED display device of claim 1, wherein the bottom layer pair of the first Bragg reflection element is connected to the color conversion layer.

14. A micro LED display device, comprising:
   a light emitting layer;
   a color conversion layer disposed on a light emitting surface of the light emitting layer; and
   a Bragg reflection element disposed on the color conversion layer, the Bragg reflection element comprising a plurality of layer pairs, and each of the layer pairs comprising at least one first layer and at least one second layer alternately stacked, wherein the layer pairs comprise:
   a top layer pair;
   a bottom layer pair; and
   a plurality of middle layer pairs disposed between the top layer pair and the bottom layer pair, and a thickness of the top layer pair is smaller than a thickness of each of the middle layer pairs,
   wherein a refractive index of the first layer is greater than a refractive index of the second layer.

15. The micro LED display device of claim 14, wherein a thickness of the first layer of each of the middle layer pairs is smaller than $\lambda/4n_1$ and a thickness of the second layer of each of the middle layer pairs is greater than $\lambda/4n_2$, wherein $\lambda$ is an emission wavelength of the light emitting layer, $n_1$ is the refractive index of the first layer, and $n_2$ is the refractive index of the second layer.

16. The micro LED display device of claim 14, wherein the thickness of the bottom layer pair is smaller than a thickness of each of the middle layer pairs.

17. The micro LED display device of claim 14, wherein the thickness of the top layer pair is greater than a thickness of the bottom layer pair.

18. A micro LED display device, comprising:
   a light emitting layer;
   a color conversion layer disposed on a light emitting surface of the light emitting layer; and
   a first Bragg reflection element disposed on the color conversion layer, the first Bragg reflection element comprising a plurality of layer pairs, wherein the layer pairs comprise:
   a top layer pair;
   a bottom layer pair; and
   a plurality of middle layer pairs disposed between the top layer pair and the bottom layer pair, wherein each of the middle layer pairs has the same thickness that is different from a thickness of the top layer pair and different from a thickness of the bottom layer pair, and wherein the bottom layer pair is connected to the color conversion layer.

19. The micro LED display device of claim 18, wherein each of the layer pairs comprises at least one first layer and at least one second layer alternately stacked, and a refractive index of the first layer is greater than a refractive index of the second layer.

20. The micro LED display device of claim 18, further comprising:
   a second Bragg reflection element connected to the light emitting layer.

* * * * *